(12) United States Patent
Nagai et al.

(10) Patent No.: US 9,130,540 B2
(45) Date of Patent: Sep. 8, 2015

(54) HIGH-FREQUENCY MODULE HAVING INDUCTORS DISPOSED WITH DIRECTIONS OF THEIR POLARITIES OPPOSITE TO EACH OTHER

(71) Applicant: Murata Manufacturing Co., Ltd., Nagaokakyo-shi, Kyoto-fu (JP)

(72) Inventors: Tatsuro Nagai, Nagaokakyo (JP); Masanori Kato, Nagaokakyo (JP); Takashi Kihara, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 159 days.

(21) Appl. No.: 13/961,953

(22) Filed: Aug. 8, 2013

(65) Prior Publication Data

US 2014/0009240 A1 Jan. 9, 2014

Related U.S. Application Data

(63) Continuation of application No. PCT/JP2012/051382, filed on Jan. 24, 2012.

(30) Foreign Application Priority Data

Feb. 9, 2011 (JP) ................................. 2011-026092

(51) Int. Cl.
*H03H 9/70* (2006.01)
*H03H 9/72* (2006.01)
(Continued)

(52) U.S. Cl.
CPC ................. *H03H 9/70* (2013.01); *H03H 7/463* (2013.01); *H03H 9/0028* (2013.01); *H03H 9/0095* (2013.01); *H03H 9/706* (2013.01); *H03H 9/725* (2013.01)

(58) Field of Classification Search
CPC ... H03H 7/463; H03H 9/0566; H03H 9/0571; H03H 9/0576; H03H 9/6433; H03H 9/6483; H03H 9/706; H03H 9/725; H03H 9/0028; H03H 9/0095; H03H 9/70
USPC ...................................... 333/133; 455/78–83
See application file for complete search history.

(56) References Cited

U.S. PATENT DOCUMENTS 4,543,554 A * 9/1985 Muellenheim et al. ......... 336/83
5,754,667 A * 5/1998 Nazar et al. ..................... 381/99
(Continued)

FOREIGN PATENT DOCUMENTS

JP 64-28022 U 2/1989
JP 2002-164704 A 6/2002
(Continued)

OTHER PUBLICATIONS

Official Communication issued in corresponding Japanese Patent Application No. 2012-556818, mailed on May 7, 2014.
Official Communication issued in corresponding German Patent Application No. 11 2012 000 737.9, mailed on Apr. 28, 2014.
Official Communication issued in International Patent Application No. PCT/JP2012/051382, mailed on Mar. 19, 2012.

*Primary Examiner* — Barbara Summons
(74) *Attorney, Agent, or Firm* — Keating & Bennett, LLP

(57) ABSTRACT

A high-frequency module includes a mount board, a wave splitter chip mounted on one principal surface of the mount board and including a transmission filter and a reception filter, a first inductor chip mounted on one principal surface of the mount board and including an inductor, and a second inductor chip mounted on one principal surface of the mount board and including an inductor. The first and second inductor chips are disposed adjacent to each other and each has a polarity. The first and second inductor chips are disposed such that the polarities thereof are opposite to each other, as viewed from the reception filter.

14 Claims, 3 Drawing Sheets

(51) Int. Cl.
*H03H 7/46* (2006.01)
*H03H 9/00* (2006.01)

(56) References Cited

U.S. PATENT DOCUMENTS

| | | | |
|---|---|---|---|
| 7,135,944 B2 * | 11/2006 | Iwamoto et al. | 333/133 |
| 2004/0012461 A1 * | 1/2004 | Uriu et al. | 333/133 |
| 2006/0139125 A1 * | 6/2006 | Shiga-ken et al. | 333/193 |
| 2007/0190954 A1 * | 8/2007 | Murakami et al. | 455/132 |
| 2007/0268091 A1 | 11/2007 | Iwamoto et al. | |
| 2008/0218927 A1 | 9/2008 | Harada et al. | |
| 2011/0037535 A1 * | 2/2011 | Kitamura | 333/134 |

FOREIGN PATENT DOCUMENTS

| | | |
|---|---|---|
| JP | 2002-329611 A | 11/2002 |
| JP | 2006-279604 A | 10/2006 |
| JP | 2007-124537 A | 5/2007 |
| JP | 2007-312145 A | 11/2007 |
| JP | 2008-167105 A | 7/2008 |
| WO | 2007/034589 A1 | 3/2007 |
| WO | 2008/023510 A1 | 2/2008 |
| WO | WO 2009/136472 * | 11/2009 |
| WO | 2010/107430 A1 | 9/2010 |

* cited by examiner

HIGH-FREQUENCY MODULE HAVING INDUCTORS DISPOSED WITH DIRECTIONS OF THEIR POLARITIES OPPOSITE TO EACH OTHER

BACKGROUND OF THE INVENTION

1. Field of the Invention

The present invention relates to a high-frequency module, and more particularly to a high-frequency module in which at least one wave splitter chip and a plurality of chip inductors are mounted on a mount board.

2. Description of the Related Art

Hitherto, a high-frequency module in which a filter device and chip components are mounted on a mount board has been used for cellular phones, etc. For example, WO 2008/023510 A1 Publication discloses a high-frequency module in which a plurality of elastic wave filter chips and a plurality of chip inductors are mounted on a mount board.

These days, as the size of mobile communication devices, such as cellular phones, is becoming smaller and the functionality thereof is being increased, there is also a growing demand for decreasing the size of a high-frequency module mounted on a mobile communication device. As effective measures to reduce the size of a high-frequency module, components of the high-frequency module may be mounted on a mount board with high density. In this case, however, the components mounted on the mount board with high density are likely to interfere with each other, which may deteriorate characteristics of the high-frequency module.

In particular, in a high-frequency module including a transmission filter and a reception filter which has a balanced-unbalanced transforming function, if chip inductors connected to first and second balanced signal terminals of the reception filter are disposed adjacent to each other, isolation may deteriorate due to the interaction of the chip inductors.

Accordingly, it is difficult to sufficiently reduce the size of a high-frequency module.

SUMMARY OF THE INVENTION

In view of the above-described problem, preferred embodiments of the present invention significantly reduce the size of a high-frequency module in which a wave splitter chip and a plurality of chip inductors are mounted on a mount board.

A high-frequency module according to a preferred embodiment of the present invention includes an antenna-side terminal connected to an antenna terminal, a transmission signal terminal, first and second reception balanced signal terminals, a transmission filter, a reception filter, and a plurality of inductors. The transmission filter is connected between the antenna terminal and the transmission signal terminal. The reception filter is connected between the antenna terminal and the first and second reception balanced signal terminals. The reception filter has a balanced-unbalanced transforming function. The plurality of inductors are connected between the reception filter and the first or second reception balanced signal terminal. The high-frequency module according to a preferred embodiment of the present invention includes a mount board, a wave splitter chip, and a plurality of inductor chips. The wave splitter chip is mounted on one principal surface of the mount board. The wave splitter chip includes the transmission filter and the reception filter. The plurality of inductor chips are mounted on one principal surface of the mount board. The plurality of inductor chips include the inductors. Among the plurality of inductor chips, two inductor chips disposed adjacent to each other each have a polarity and are disposed such that directions of the polarities are opposite to each other, as viewed from the reception filter.

According to a specific aspect of the high-frequency module according to a preferred embodiment of the present invention, the high-frequency module may further include a first inductor chip including a first inductor connected between the reception filter and the first reception balanced signal terminal; and a second inductor chip including a second inductor connected between the reception filter and the second reception balanced signal terminal. The first and second inductor chips may be disposed adjacent to each other.

According to another specific aspect of the high-frequency module according to a preferred embodiment of the present invention, the high-frequency module may further include a first inductor chip including a first inductor connected between the reception filter and the first reception balanced signal terminal; a second inductor chip including a second inductor connected between the reception filter and the second reception balanced signal terminal; and a third inductor chip including a third inductor connected between a node between the first inductor and the reception filter and a node between the second inductor and the reception filter. The first and third inductor chips may be disposed adjacent to each other, and the second and third inductor chips may be disposed adjacent to each other.

According to a different specific aspect of the high-frequency module according to a preferred embodiment of the present invention, the third inductor chip may be disposed such that a direction of a polarity of the third inductor chip is opposite to a direction of a polarity of the first inductor chip and a direction of a polarity of the second inductor chip, as viewed from the reception filter.

According to still another specific aspect of the high-frequency module according to a preferred embodiment of the present invention, the third inductor chip may be disposed between the first inductor chip and the second inductor chip.

According to another different specific aspect of the high-frequency module according to a preferred embodiment of the present invention, the reception filter may be a longitudinally coupled resonator-type elastic wave filter.

According to various preferred embodiments of the present invention, it is possible to reduce the size of a high-frequency module in which a wave splitter chip and a plurality of chip inductors are mounted on a mount board.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below. However, the following preferred embodiments are only examples, and the present invention is not whatsoever restricted to the following preferred embodiments.

First Preferred Embodiment

Figure 1:
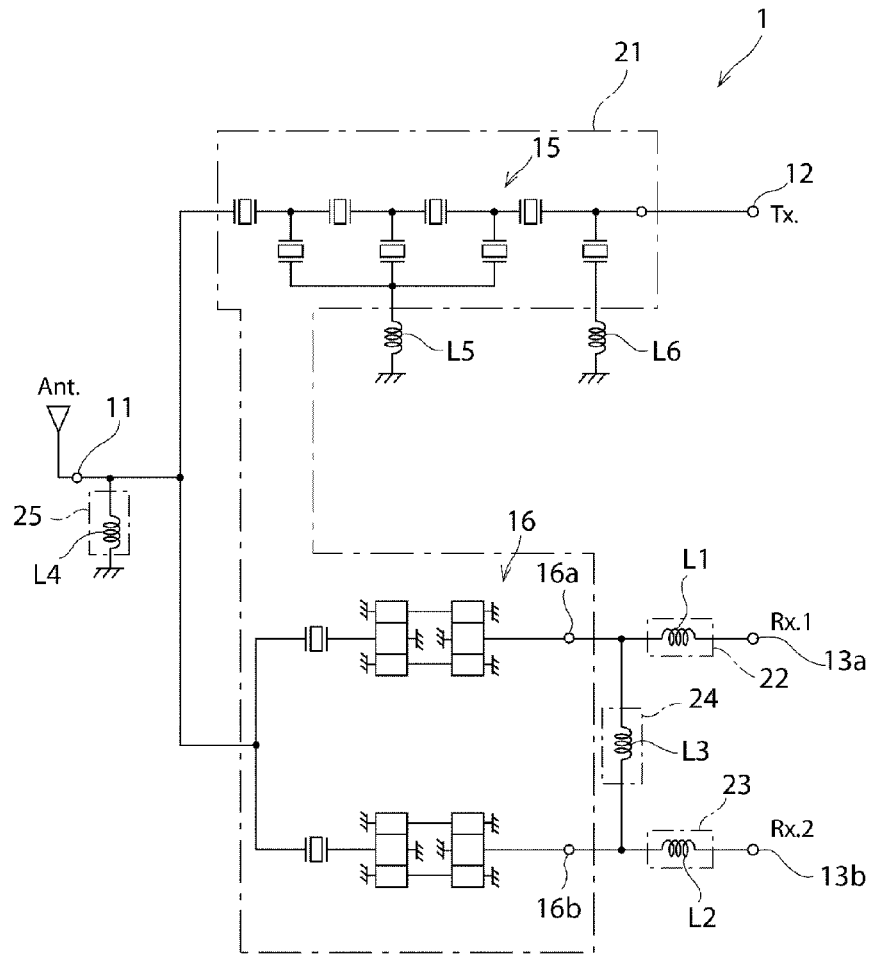
FIG. 1 is a simplified circuit diagram of a high-frequency module according to a first preferred embodiment of the present invention.

FIG. 1 is a simplified circuit diagram of a high-frequency module according to a first preferred embodiment of the present invention. A description will first be given of the circuit configuration of a high-frequency module 1 of the present preferred embodiment with reference to FIG. 1.

The high-frequency module 1 includes an antenna-side terminal 11 connected to an antenna terminal, a transmission signal terminal 12, and first and second reception balanced signal terminals 13a and 13b.

A transmission filter 15 is connected between the antenna-side terminal 11 and the transmission signal terminal 12. In this embodiment, the transmission filter 15 is constituted by a so-called ladder elastic wave filter. Inductors L5 and L6 are provided between the ladder elastic wave filter and a ground potential. These inductors L5 and L6 are constituted by wirings provided within a package of a duplexer chip 21, which will be discussed later.

A reception filter 16 is connected between the antenna-side terminal 11 and the first and second reception balanced signal terminals 13a and 13b. The reception filter 16 is a balanced elastic wave filter having a balanced-unbalanced transforming function. More specifically, in the present preferred embodiment, the reception filter 16 is a longitudinally coupled resonator-type elastic wave filter. In various preferred embodiments of the present invention, "elastic waves" include surface acoustic waves, boundary acoustic waves, and bulk acoustic waves.

An inductor L4 is connected between a ground potential and a node between the antenna-side terminal 11 and a node between the transmission filter 15 and the reception filter 16.

A first inductor L1 is connected between a first balanced signal terminal 16a of the reception filter 16 and the first reception balanced signal terminal 13a. A second inductor L2 is connected between a second balanced signal terminal 16b of the reception filter 16 and the second reception balanced signal terminal 13b. An inductor L3 is connected between a node between the first balanced signal terminal 16a and the first inductor L1 and a node between the second balanced signal terminal 16b and the second inductor L2. These inductors L1 through L3 are devices that perform impedance matching with, for example, RFICs, which will be connected to the first and second reception balanced signal terminals 13a and 13b.

Figure 2:
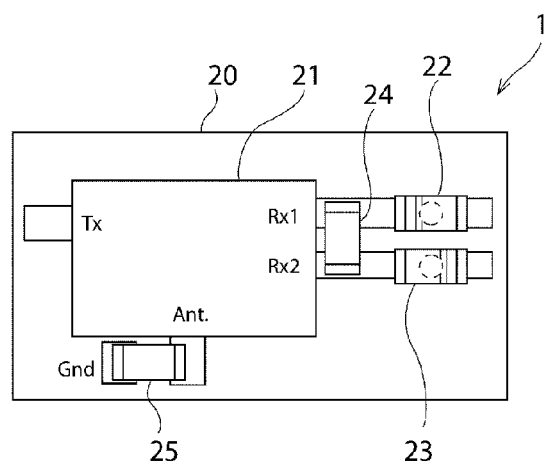
FIG. 2 is a simplified plan view of the high-frequency module according to the first preferred embodiment of the present invention.

FIG. 2 is a simplified plan view of the high-frequency module according to the first preferred embodiment. A specific configuration of the high-frequency module 1 of the present preferred embodiment will now be discussed below with reference to FIG. 2.

The high-frequency module 1 includes a mount board 20. On the front surface of the mount board 20, a duplexer chip 21, which serves as a wave splitter chip, and a plurality of inductor chips 22 through 25 are mounted. The duplexer chip 21 is connected to terminal electrodes disposed on the back surface of the mount board via wirings, such as electrodes disposed on the front surface of the mount board 20 and via-holes, which are not shown, provided within the mount board 20.

The duplexer chip 21 includes the transmission filter 15 and the reception filter 16. The inductor chip 22 includes the inductor L1. The inductor chip 23 includes the inductor L2. The inductor chip 24 includes the inductor L3. The inductor chip 25 includes the inductor L4.

The inductor chips 22 and 23 are disposed adjacent to each other. That is, another device is not disposed between the inductor chips 22 and 23. The inductor chips 22 and 23 are disposed in parallel or substantially in parallel with each other.

Figure 3:
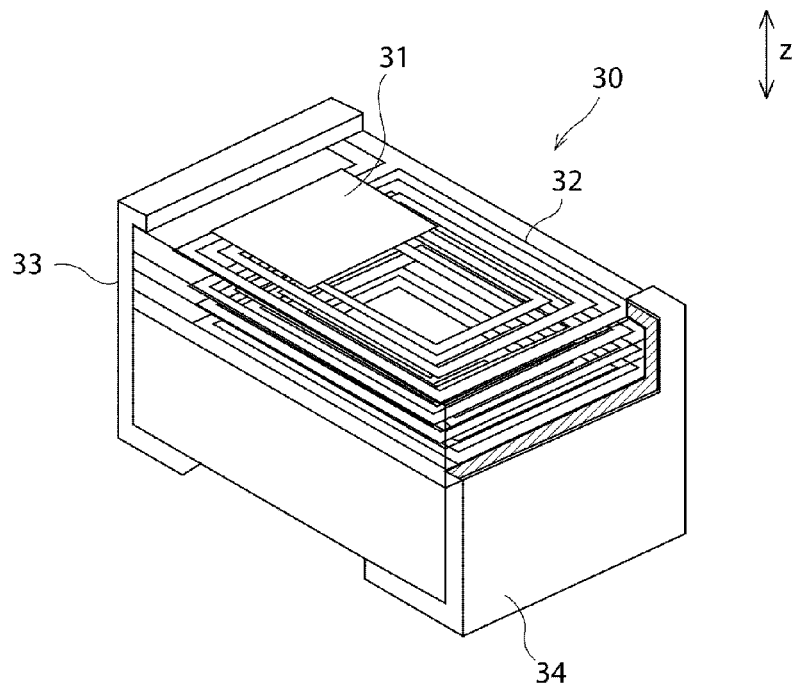
FIG. 3 is a schematic perspective view of an inductor chip.

In the present preferred embodiment, the inductor chips 22 and 23 are each constituted by an inductor chip 30 shown in FIG. 3. The inductor chip 30 is an inductor chip having a polarity.

An "inductor chip having a polarity" means an inductor chip in which, when the mounting direction of the inductor chip is changed, the direction of a magnetic field generated from the inductor changes. For example, the inductor chip 30 includes an internal electrode 32 which is spirally wound counterclockwise around an axis extending in the z direction perpendicular or substantially perpendicular to the mount surface of the mount board 20. The base end of the internal electrode 32 is connected to a first outer electrode 33 positioned farther away from the mount board, while the forward end of the internal electrode 32 is connected to a second outer electrode 34 positioned closer to the mount board. Then, in order to distinguish the outer electrode at the base end from the outer electrode at the forward end, an identification mark 31 is provided on the first outer electrode 33.

In the inductor chip 30 having a polarity, the direction of a magnetic flux generated in the inductor chip 30 changes depending on whether a signal is applied from the first outer electrode 33 or from the second outer electrode 34.

In the present preferred embodiment, the inductor chips 22 and 23 are disposed such that, when a signal is applied to one of the inductors L1 and L2, an induced electromotive force in a direction opposite to the direction of this signal is generated in the other one of the inductors L2 and L1. That is, the inductor chips 22 and 23 are disposed such that the directions of the polarities of the inductor chips 22 and 23 become opposite to each other, as viewed from the reception filter 16. More specifically, the first outer electrode 33 of one of the inductor chips 22 and 23 is connected to the side of the reception filter 16, while the first outer electrode 33 of the other one of the inductor chips 23 and 22 is connected to the side opposite to the reception filter 16.

With this arrangement, in the high-frequency module 1 of the present preferred embodiment, sufficient isolation characteristics are implemented. This advantage will be discussed below more specifically.

For example, a transmission signal sometimes leaks from the transmission filter 15 to the reception filter 16. The leakage of an undesired signal deteriorates isolation characteristics. In this case, as the power of the undesired signal is higher, isolation characteristics deteriorate more considerably, and if the power of the undesired signal is low, isolation characteristics do not deteriorate considerably.

Figure 4:
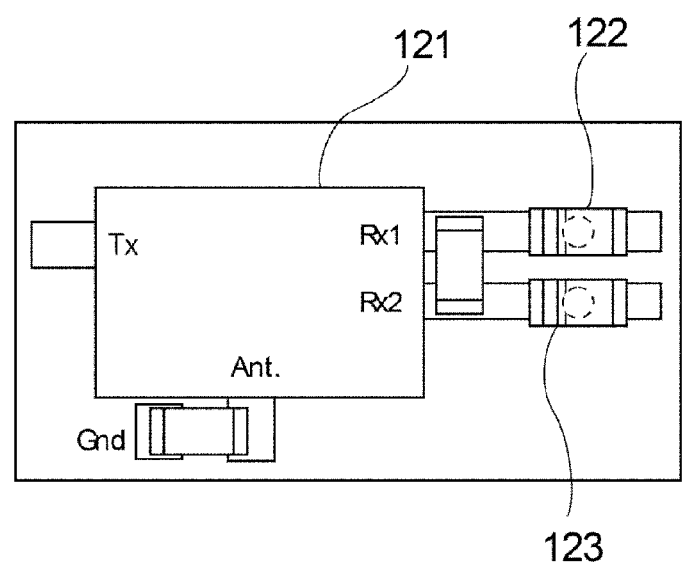
FIG. 4 is a simplified plan view of a high-frequency module according to a first comparative example.

For example, as indicated by a first comparative example shown in FIG. 4, inductor chips 122 and 123 may be disposed such that the polarities of the inductor chips 122 and 123 are the same, as viewed from the reception filter. In this case, however, if an undesired signal flows through the inductor chip 122, due to a magnetic flux generated in the inductor chip 122, an induced electromotive force in the same direction as that of the undesired signal is generated in the inductor chip 123. Similarly, if an undesired signal flows through the inductor chip 123, due to a magnetic flux generated in the inductor chip 123, an induced electromotive force in the same direction as that of the undesired signal is generated in the inductor chip 122. Accordingly, due to the induced electromotive force, the power of the undesired signal is increased. Thus, if the inductor chips 122 and 123 are disposed close to each other, isolation characteristics deteriorate significantly, which makes it impossible to dispose the inductor chips 122 and 123 close to each other. As a result, it is difficult to reduce the size of a high-frequency module.

In contrast, in the case of the present preferred embodiment, if an undesired signal flows through the inductor chip 22, due to a magnetic flux generated in the inductor chip 22, an induced electromotive force in a direction opposite to that of the undesired signal is generated in the inductor chip 23. Similarly, if an undesired signal flows through the inductor chip 23, due to a magnetic flux generated in the inductor chip 23, an induced electromotive force in a direction opposite to that of the undesired signal is generated in the inductor chip 22. Accordingly, due to the induced electromotive force, the power of the undesired signal is decreased. In this manner, in this embodiment, since the power of the undesired signal is decreased, even if the inductors L1 and L2 are disposed close to each other, isolation characteristics can be maintained sufficiently. Accordingly, the size of the high-frequency module 1 can be reduced. That is, in the high-frequency module 1 of the present preferred embodiment, the compatibility of a reduction in the size of the high-frequency module 1 and sufficient isolation characteristics are achieved.

Another preferred embodiment of the present invention will be described below. In the following description, elements having substantially the same functions as those of the elements of the first preferred embodiment will be designated by like reference numerals, and an explanation thereof will thus be omitted. In the following second preferred embodiment, reference will also be given to FIG. 1, which is referred to in the first preferred embodiment.

Second Preferred Embodiment

Figure 5:
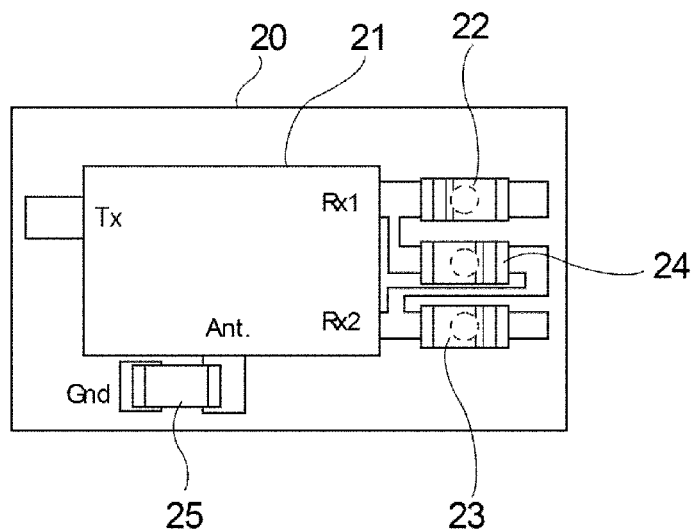
FIG. 5 is a simplified plan view of a high-frequency module according to a second preferred embodiment of the present invention.

FIG. 5 is a simplified plan view of a high-frequency module according to a second preferred embodiment of the present invention.

In the above-described first preferred embodiment, the inductor chips 22 and 23 are preferably disposed at positions at which the inductor chips 22 and 23 cause generation of an induced electromotive force in the inductor chips 23 and 22, respectively, and the inductor chip 24 defining the inductor L3 is disposed at a position at which it does not substantially cause the generation of an induced electromotive force in the inductor chip 22 or 23.

In contrast, in the present preferred embodiment, the inductor chip 24 has a polarity. The inductor chip 24 is disposed between the inductor chips 22 and 23. That is, the inductor chips 22 through 24 are linearly arranged. The inductor chip 24 is disposed such that, when a signal is applied to one of the inductor chips 22 and 23, an induced electromotive force in a direction opposite to the direction of the signal is generated in the inductor chip 24. More specifically, the inductor chip 24 is disposed such that the direction of the polarity is opposite to that of the inductor chip 22 and that of the inductor chip 23, as viewed from the reception filter 16.

With this arrangement, if an undesired signal flows through the inductor chip 22, due to a magnetic flux generated in the inductor chip 22, an induced electromotive force in a direction opposite to the direction of the undesired signal is generated, not only in the inductor chip 23, but also in the inductor chip 24. Similarly, when an undesired signal flows through the inductor chip 23, due to a magnetic flux generated in the inductor chip 23, an induced electromotive force in a direction opposite to the direction of the undesired signal is generated, not only in the inductor chip 22, but also in the inductor chip 24. Accordingly, the power of the undesired signal is effectively decreased. Thus, isolation characteristics can be further improved.

Additionally, since the inductor chips 22 through 24 are arranged linearly, the dimension of a direction perpendicular or substantially perpendicular to the arrangement direction of the inductor chips 22 through 24 can be made smaller than that in the high-frequency module of the above-described first preferred embodiment.

Modified Example of Preferred Embodiments

In the above-described preferred embodiments, an example in which the high-frequency module includes one wave splitter chip has been discussed. However, the present invention is not restricted to this configuration. A high-frequency module according to a preferred embodiment of the present invention may include a plurality of wave splitter chips. A high-frequency module according to a preferred embodiment of the present invention may also include another filter chip in addition to at least one wave splitter chip.

A preferred embodiment of the present invention will be described below in greater details through illustration of a specific example. However, the following example is only an illustration, and the present invention is not whatsoever restricted to the following example.

First Example

In this example, a high-frequency module having substantially the same configuration as that of the high-frequency module of the above-described second preferred embodiment was fabricated. As the duplexer, a duplexer for UMTS-Band5 was used. Differential isolation characteristics concerning differential isolation from a transmission signal terminal to reception signal terminals of the high-frequency module of the first example are shown in FIG. 6.

Second Comparative Example

In a second comparative example, a high-frequency module having a configuration similar to that of the above-described first example, except that the polarity of the inductor chip 24 was opposite to that in the first example, was fabricated. The inductor chip 24 is disposed such that, by reversing the polarity of the inductor chip 24, the polarity of the inductor chip 24 is the same as that of the inductor chip 22 and that of the inductor chip 23, as viewed from the reception filter 16. Differential isolation characteristics concerning differential isolation from a transmission signal terminal to reception signal terminals of the high-frequency module of the second comparative example are shown in FIG. 6.

Figure 6:
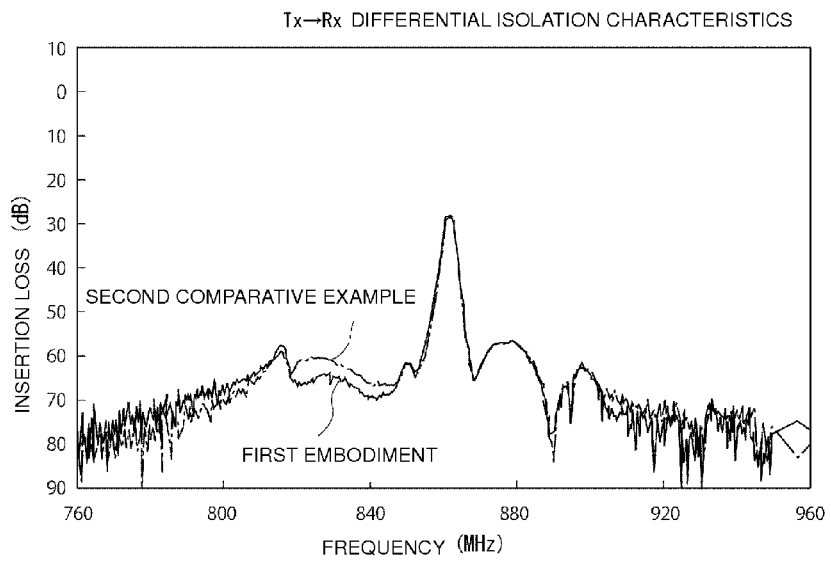
FIG. 6 is a graph illustrating differential isolation characteristics concerning differential isolation from a transmission signal terminal to reception signal terminals of a first example and those of a second comparative example.

The results of FIG. 6 show that differential isolation characteristics can be further improved by disposing the inductor chip 24 such that the polarity of the inductor chip 24 is opposite to that of the inductor chip 22 and that of the inductor chip 23, as viewed from the reception filter 16.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   an antenna-side terminal connected to an antenna terminal;
   a transmission signal terminal;
   first and second reception balanced signal terminals;
   a transmission filter connected between the antenna terminal and the transmission signal terminal;
   a reception filter connected between the antenna terminal and the first and second reception balanced signal terminals, the reception filter having a balanced-unbalanced transforming function;
   a plurality of inductors connected between the reception filter and the first or second reception balanced signal terminal;
   a mount board;
   a wave splitter chip mounted on one principal surface of the mount board and including the transmission filter and the reception filter; and
   a plurality of inductor chips mounted on the one principal surface of the mount board and including the plurality of inductors; wherein
   the plurality of inductor chips include a first inductor chip including a first inductor connected between the reception filter and the first reception balance signal terminal and a second inductor chip including a second inductor connected between the reception filter and the second reception balance signal terminal; and
   the first and second inductor chips are disposed adjacent to each other, each of the first and second inductor chips has a polarity, and the first and second inductor chips are arranged such that directions of the polarities are opposite to each other, as viewed from the reception filter.

2. The high-frequency module according to claim 1, wherein the plurality of inductor chips further include:
   a third inductor chip including a third inductor connected between a node between the first inductor and the reception filter and a node between the second inductor and the reception filter; and
   the first and third inductor chips are disposed adjacent to each other, and the second and third inductor chips are disposed adjacent to each other.

3. The high-frequency module according to claim 1, wherein the reception filter is a longitudinally coupled resonator-type elastic wave filter.

4. The high-frequency module according to claim 1, wherein the transmission filter is a ladder elastic wave filter.

5. The high-frequency module according to claim 1, wherein the reception filter is a balanced elastic wave filter having a balanced-unbalanced transforming function.

6. The high-frequency module according to claim 1, wherein the wave splitter chip is connected to terminal electrodes disposed on a surface of the mount board via wirings.

7. The high-frequency module according to claim 1, wherein the first and second inductor chips are disposed parallel or substantially parallel to each other.

8. The high-frequency module according to claim 1, wherein another one of the inductor chips is arranged so as not to substantially cause generation of an induced electromotive force in at least one of the first and second inductor chips.

9. The high-frequency module according to claim 1, further comprising a plurality of the wave-splitter chip.

10. The high-frequency module according to claim 1, further comprising a filter chip.

11. A high-frequency module comprising:
    an antenna-side terminal connected to an antenna terminal;
    a transmission signal terminal;
    first and second reception balanced signal terminals;
    a transmission filter connected between the antenna terminal and the transmission signal terminal;
    a reception filter connected between the antenna terminal and the first and second reception balanced signal terminals, the reception filter having a balanced-unbalanced transforming function;
    a plurality of inductors connected between the reception filter and the first or second reception balanced signal terminal;
    a mount board;
    a wave splitter chip mounted on one principal surface of the mount board and including the transmission filter and the reception filter; and
    a plurality of inductor chips mounted on one principal surface of the mount board and including the inductors; wherein among the plurality of inductor chips, two inductor chips disposed adjacent to each other each have a polarity and are disposed such that directions of the polarities are opposite to each other, as viewed from the reception filter; wherein
    the plurality of inductor chips include:
      a first inductor chip including a first inductor connected between the reception filter and the first reception balanced signal terminal;
      a second inductor chip including a second inductor connected between the reception filter and the second reception balanced signal terminal; and
      a third inductor chip including a third inductor connected between a node between the first inductor and the reception filter and a node between the second inductor and the reception filter;
    the first and third inductor chips are disposed adjacent to each other, and the second and third inductor chips are disposed adjacent to each other; and
    the third inductor chip is disposed between the first inductor chip and the second inductor chip.

12. The high-frequency module according to claim 11, wherein the third inductor chip is disposed such that a direction of a polarity of the third inductor chip is opposite to one of the direction of the polarity of the first inductor chip and the direction of the polarity of the second inductor chip, as viewed from the reception filter.

13. A high-frequency module comprising:
    an antenna-side terminal connected to an antenna terminal;
    a transmission signal terminal;
    first and second reception balanced signal terminals;
    a transmission filter connected between the antenna terminal and the transmission signal terminal;
    a reception filter connected between the antenna terminal and the first and second reception balanced signal terminals, the reception filter having a balanced-unbalanced transforming function;
    a plurality of inductors connected between the reception filter and the first or second reception balanced signal terminal;
    a mount board;
    a wave splitter chip mounted on one principal surface of the mount board and including the transmission filter and the reception filter; and a plurality of inductor chips mounted on one principal surface of the mount board and including the inductors; wherein among the plurality of inductor chips, two inductor chips each have a polarity and are disposed such that directions of the polarities are opposite to each other, as viewed from the reception filter;

the two inductor chips are disposed to cause generation of an induced electromotive force in the inductor chips; and another one of the plurality of inductor chips has a polarity and is arranged along a line between the two inductor chips such that, when a signal is applied to one of the two inductor chips, an induced electromotive force in a direction opposite to the direction of the signal is generated in the another one of the plurality of inductor chips.

14. The high-frequency module according to claim 13, wherein the another one of the inductor chips is disposed such that a direction of the polarity thereof is opposite to the direction of the polarity of one of the two inductor chips, as viewed from the reception filter.

* * * * *